United States Patent [19]
Holderer et al.

[11] Patent Number: 5,991,101
[45] Date of Patent: Nov. 23, 1999

[54] UV-RESISTANT JOINTING TECHNIQUE FOR LENSES AND MOUNTS

[75] Inventors: Hubert Holderer, Königsbronn; Johannes Christ, Schweinhausen, both of Germany

[73] Assignee: Carl-Zeiss-Stiftung, Germany

[21] Appl. No.: 09/209,911

[22] Filed: Dec. 11, 1998

[30] Foreign Application Priority Data

Dec. 12, 1997 [DE] Germany .......................... 197 55 356

[51] Int. Cl.$^6$ .................................................. G02B 7/02
[52] U.S. Cl. ............................................................. 359/819
[58] Field of Search .................................. 359/819, 820; 362/455; 353/100

[56] References Cited

U.S. PATENT DOCUMENTS 5,009,481  4/1991  Kinoshita et al. ......................... 385/33

FOREIGN PATENT DOCUMENTS

| 0 170 513 | 5/1986 | European Pat. Off. . |
| 0 761 623 A2 | 12/1997 | European Pat. Off. . |
| 29 00 356 | 12/1979 | Germany . |
| 1 468 973 | 3/1977 | United Kingdom . |

OTHER PUBLICATIONS

Patent Abstracts of Japan, vol. 010, No. 369 (P–525), Oct. 12, 1986 JP 61 162011 A (Fujitsu Ltd.) Jul. 22, 1986.
European Search Report EP 98 12 1444. Mar. 23, 1999.

*Primary Examiner*—Georgia Epps
*Assistant Examiner*—Ricky Mack

[57] ABSTRACT

An optical element of non-metallic, transparent, material, preferably quartz glass or calcium fluoride, is fastened to a mount or a mount element that is provided with a surface that forms a gap with the optical element. The surface that forms the gap is coated with a metal solder that melts at a temperature below about 100° C. The optical element is placed at the metal solder, and the metal is melted, resulting in a positively locking connection with the optical element.

24 Claims, 1 Drawing Sheet

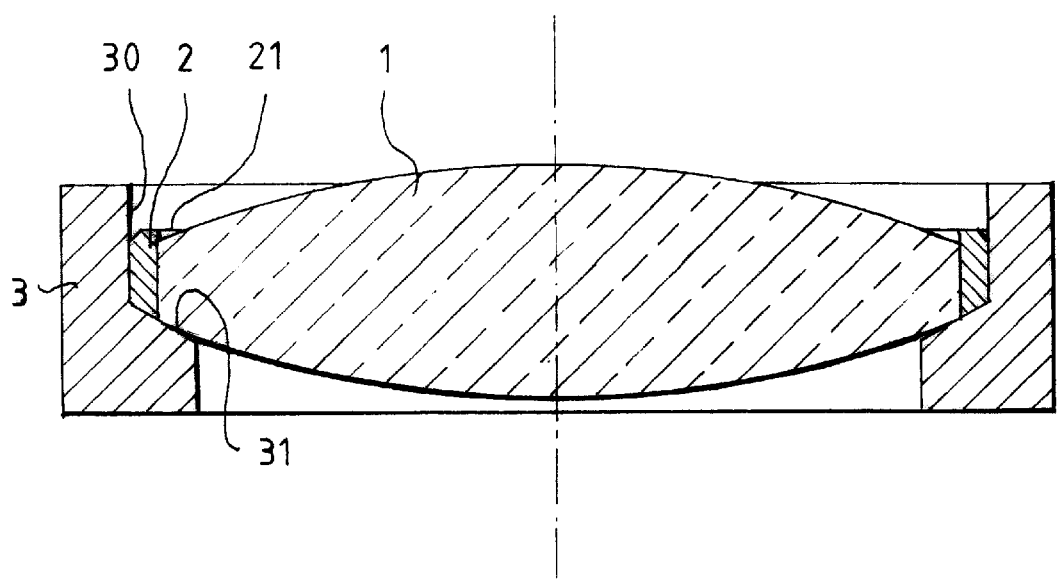

UV-RESISTANT JOINTING TECHNIQUE FOR LENSES AND MOUNTS

CROSS-REFERENCES TO RELATED APPLICATIONS (Not applicable).

STATEMENT REGARDING FEDERALLY SPONSORED RESEARCH OR DEVELOPMENT (Not applicable).

BACKGROUND OF THE INVENTION

1. Field of the Invention

The invention relates to an optical assembly of an optical element of transparent material and a mount or mount element.

The invention also relates to a process for fastening an optical element of non-metallic, transparent material, particularly quartz glass or calcium fluoride, to a mount or mount element.

The mount or mount element in the sense of the invention is to be understood to mean any component that is not in itself light-conducting and is suitable for mechanically fixing one or more optical elements and connecting them into an optical assembly or bringing them into operative connection, or bringing them into operative connection with adjusting elements.

The invention further relates to UV optical systems, microscopes and projection illumination equipments with at least one optical assembly according to the invention.

2. Discussion of Relevant Art

Jointing techniques for the connection of lenses, prisms, flat plates and mirrors to mounts are well known.

Cementing is important because particularly small stresses on the optical parts are attained. Modern forms use UV setting adhesives. The organic cements however exhibit distinct radiation damage when irradiated with wavelengths shorter than the Hg-I line, so that they are hardly usable for DUV projection illumination equipments with a 193 nm excimer laser.

Conventional positive connections such as flanging or attachment rings produce excessive strains in the optical material in this field of application.

Annular brazing of glass and the like to mounts is known from European Patent EP 0 761 623. These serve primarily as gastight joints of windows for lasers, vacuum chambers and the like. As a rule, the operation uses high temperatures in the brazing region at about 400° C. and higher. Such high temperature treatment is excluded in the case of finished precision optics with antireflection layers and the like.

From U.S. patent application Ser. No. 09/134,227 of Carl Zeiss, a suitable soldering technique for optical precision mounts is known, with an adhesion layer of quartz or calcium fluoride, as well as providing a material locking connection of a local nature with studs or lugs.

SUMMARY OF THE INVENTION

The object of the invention is to provide a UV-resistant, high precision jointing technique with little stress and temperature loading.

This object is attained by an optical assembly having an optical element of non-metallic material, a mount or mount element, and a layer of a solder arranged between the optical element and the mount or mount element that forms a positively locking connection to the optical element. This object also is attained by a process for fastening an optical element of nonmetallic, transparent material comprising providing a surface of the mount or the mount element that forms a gap with the optical element, coating the surface that forms the gap with the optical element with solder, placing the optical element at the solder, and melting the solder, resulting in a positively locking connection of the mount or mount element with the optical element.

A microscope or a projection illumination equipment or an optical system having an optical assembly according to the present invention is also attained.

The jointing technique according to the invention can thus be characterized as a kind of flanging by melting. Differing from soldering, brazing or welding, a material locking of the joint is not required, but a positive locking is produced. The solders that are commercially used in soldering, and in particular the low-melting metals and metal alloys, are used.

BRIEF DESCRIPTION OF THE DRAWING

The invention will be described in detail with reference to the drawing, in which:

FIG. 1 shows in schematic cross section a lens held in a mount.

DETAILED DESCRIPTION OF PREFERRED EMBODIMENTS

FIG. 1 shows in schematic cross section a lens 1 held in a mount or mount element 3 with a ring 2 of soft solder.

A mount or mount element 3 is produced with a larger diameter for the lens seat (solder gap 0.1 mm); thus there is on the mount or mount element 3 an annular surface 30 which forms a gap with the lens 1. The lens seat (surface 30) is soldered, and as a rule (but not imperatively) a material locking solder connection is obtained. A solder 2 typically has a thickness of 0.1 mm. The solder application can take place by electroplating or by conventional application of the melt.

The exact lens seat is thereafter finished (turned) with a clearance fit, so that the lens 1 can be correctly positioned. The lower lens abutment surface 31 must be free from solder in order to insure the positional fixation.

The lens 1 is then placed in the mount or mount element 3 and is heated, with the mount or mount element 3, on a hotplate until the solder 2 melts. In order to insure accurate and fixed positioning of the lens 1, the lens 1 can be clamped or fixed in a jig during the heating.

The solder 2 encloses the lens external diameter, and after cooling the lens 1 is firmly seated in its place because the solder 2 completely abuts the outer edge of the lens 1 and flows slightly over the upper edge, thus forming a kind of flange edge 21. The process thus leads to pure positive locking.

This process is also outstandingly suitable for mounting $CaF_2$ because with uniform heating no temperature strains can arise.

The material for the mount or mount element 3 should have a coefficient of thermal expansion similar to that of the lens 1. For example, when the lens 1 is made of quartz glass, the mount or mount element 3 may be made of invar (a nickel alloy with minimal thermal expansion). As the solder 2, a metal with a melting point below about 100°, 50–70° C. is preferred, e.g., the alloy BiPbSnIn with melting point 58° C. According to the kind of glass and the conditions of use, higher-melting solders, as a rule soft solders, can also be used.

This jointing technique is particularly suitable for lenses 1 up to a few centimeters in diameter (in this embodiment, a diameter of 20 mm), e.g. in UV microscopes or for small lenses in projection illuminating equipments for microlithography. In the same way, mirrors of mirror-coated glass or glass-ceramic, or ceramic bodies, prisms and other optical elements, can be fastened to a mount.

Individual optical elements can be connected to several separated mount elements with solder in this manner. The mount elements can be connected by means of optional (metal-metal) jointing techniques to other parts, e.g., to annular mount parts.

We claim:

1. An optical assembly comprising:
   an optical element (1) of non-metallic material,
   a mount or mount element (3), and
   a layer (2) of a solder arranged between said optical element (1) and said mount or mount element (3) and having a positively locking flange edge (21) that forms a positively locking connection to said optical element (1),
   said mount or mount element (3) having an abutment surface (31) to which said optical element (1) is directly contiguous, said abutment surface (31) being located opposite to said positively locking flange edge (21).

2. The optical assembly according to claim 1, in which said non-metallic material comprises a transparent material.

3. The optical assembly according to claim 1, in which said solder comprises a solder that melts below about 100° C.

4. A projection exposure apparatus of microlithography comprising at least one assembly according to claim 1.

5. The optical assembly according to claim 1, in which said layer (2) has a thickness of the order of magnitude of 0.1 mm.

6. The optical assembly according to claim 1, in which said optical element (1) comprises a lens.

7. The optical assembly according to claim 6, in which said lens consists of a quartz glass or calcium fluoride.

8. The optical assembly according to claim 6, in which said mount or mount element (3) and said layer of solder (2) are annular in shape.

9. An optical assembly according to claim 1, in which said mount or mount element (3) has a coefficient of thermal expansion similar to that of said optical element (1).

10. An optical system that is exposed to light in a spectral region below 360 nm, comprising at least one optical assembly according to claim 1.

11. A microscope comprising at least one optical assembly according to claim 1.

12. A process for fastening an optical element (1) of non-metallic material to a mount or mount element (3), comprising:
   providing a surface (30) of said mount or mount element (3) that forms a gap with said optical element (1),
   coating said surface (30) that forms a gap with said optical element (1) with a solder (2),
   placing said optical element (1) at said solder (2), and
   melting said solder (2), resulting in a positively locking connection of said mount or mount element (3) with said optical element (1).

13. The process according to claim 12, in which said melting step comprises simultaneously heating and then cooling an entire optical assembly of said optical element (1) and said mount or mount element (3).

14. The process according to claim 12, in which said non-metallic material comprises quartz glass or calcium fluoride.

15. The process according to claim 12, in which said solder comprises a metal (2) that melts at a temperature below about 100° C.

16. The process according to claim 12, further comprising:
   providing said mount or mount element (3) with an abutment surface (31), and said placing step comprises placing said optical element (1) on said abutment surface (31).

17. The process according to claim 12, in which said coating step comprises applying said solder (2) as a metal that melts below about 100° C. to said mount or mount element (3) in a layer (2) of the order of 0.1 mm in thickness.

18. The process according to claim 12, which comprises applying said solder (2) by electroplating.

19. The process according to claim 12, further comprising metal cutting removal of material from said solder (2) before said optical element (3) is put in place.

20. The process according to claim 19, in which said removing step comprises machining said solder (2).

21. The process according to claim 19, in which said removing step comprises machining said solder (2) by turning.

22. The process according to claim 12, further comprising fixing said optical element (1) with a jig with respect to said mount or mount element (3) during melting of said solder (2).

23. The process according to claim 12, in which said optical element (1) comprises a lens.

24. The process according to claim 12, in which said surface (30) that forms a gap is annular, and said solder (2) forms an annular layer.

* * * * *